United States Patent
Larsen

(10) Patent No.: US 10,305,283 B1
(45) Date of Patent: May 28, 2019

(54) POWER ANGLE FEEDFORWARD SIGNAL FOR PHASE LOCKED LOOP IN WIND TURBINE POWER SYSTEMS

(71) Applicant: General Electric Company, Schenectady, NY (US)

(72) Inventor: Einar Vaughn Larsen, Ballston Lake, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/902,184

(22) Filed: Feb. 22, 2018

(51) Int. Cl.
| | |
|---|---|
| *F03D 7/04* | (2006.01) |
| *F03D 9/25* | (2016.01) |
| *H02J 3/18* | (2006.01) |
| *H02K 7/18* | (2006.01) |
| *H02P 9/02* | (2006.01) |
| *H02J 3/38* | (2006.01) |
| *H02J 13/00* | (2006.01) |
| *H03L 7/08* | (2006.01) |

(52) U.S. Cl.
CPC ............ *H02J 3/18* (2013.01); *F03D 7/048* (2013.01); *F03D 9/257* (2017.02); *H02J 3/386* (2013.01); *H02J 13/0006* (2013.01); *H02K 7/1838* (2013.01); *H02P 9/02* (2013.01); *H03L 7/08* (2013.01)

(58) Field of Classification Search
USPC ............ 290/44, 55; 363/48, 131; 307/52, 66
See application file for complete search history.

(56) References Cited

U.S. PATENT DOCUMENTS

| | | | |
|---|---|---|---|
| 4,994,684 | A | 2/1991 | Lauw et al. |
| 7,224,081 | B2 | 5/2007 | Larsen |
| 7,312,537 | B1 | 12/2007 | Walling |
| 7,397,143 | B2 | 7/2008 | Walling |
| 7,629,705 | B2 | 12/2009 | Barker et al. |

(Continued)

FOREIGN PATENT DOCUMENTS

| | | |
|---|---|---|
| CN | 101924371 A | 12/2010 |
| WO | WO2010125687 A1 | 11/2010 |

OTHER PUBLICATIONS

Boemer et al., Fault Ride-through Requirements for Onshore Wind Power Plants in Europe: The Needs of the Power System, Power and Energy Society General Meeting 2011, Detroit, Session Impacts of LVRT on Wind Machines, IEEE, Jul. 24, 2011, pp. 1-8.

*Primary Examiner* — Pedro J Cuevas
(74) *Attorney, Agent, or Firm* — Dority & Manning, P.A.

(57) ABSTRACT

A method for reducing a delay between a power command and actual power of a power system includes receiving, via a power angle estimator, a power command of the power system. The method also includes receiving, via the power angle estimator, one or more grid conditions of the power grid. Further, the method includes estimating, via the power angle estimator, a power angle signal across the power system based on the power command and the one or more grid conditions. Moreover, the method includes receiving, via a phase locked loop (PLL), the estimated power angle signal. In addition, the method includes generating, via the PLL, a PLL phase angle signal based, at least in part, on the estimated power angle signal. Thus, the method further includes controlling, via a converter controller, a power conversion assembly of the power system based on the PLL phase angle signal.

20 Claims, 7 Drawing Sheets

(56) References Cited

U.S. PATENT DOCUMENTS

| | | |
|---|---|---|
| 8,046,109 B2 | 10/2011 | Larsen et al. |
| 9,356,448 B2 * | 5/2016 | Sugimoto ................. H02J 4/00 |
| 9,698,603 B2 * | 7/2017 | Sugimoto ............. H01M 10/44 |
| 9,711,964 B2 | 7/2017 | Achilles et al. |
| 10,090,685 B2 * | 10/2018 | Shim ..................... H02J 7/0021 |
| 2009/0027037 A1 * | 1/2009 | Strnad ...................... H02J 3/38 |
| | | 324/76.11 |
| 2010/0135789 A1 | 6/2010 | Zheng et al. |
| 2010/0268393 A1 | 10/2010 | Fischle et al. |
| 2011/0064573 A1 | 3/2011 | Viripullan et al. |
| 2011/0089693 A1 | 4/2011 | Nasiri |
| 2011/0109086 A1 | 5/2011 | Stiesdal |
| 2011/0137474 A1 | 6/2011 | Larsen et al. |
| 2011/0187109 A1 | 8/2011 | Ichinose et al. |
| 2011/0215578 A1 | 9/2011 | Ichinose et al. |
| 2012/0051104 A1 * | 3/2012 | Ohshima ................... H02J 3/14 |
| | | 363/84 |
| 2012/0089261 A1 * | 4/2012 | Kim .................... H02J 13/0062 |
| | | 700/286 |
| 2013/0015660 A1 | 1/2013 | Hesselbaek et al. |
| 2014/0152110 A1 * | 6/2014 | Sugimoto ................. H02J 4/00 |
| | | 307/66 |
| 2015/0357820 A1 * | 12/2015 | Sugimoto ............. H01M 10/44 |
| | | 307/52 |
| 2016/0006338 A1 * | 1/2016 | Sakimoto .......... H02M 7/53875 |
| | | 363/131 |

* cited by examiner

POWER ANGLE FEEDFORWARD SIGNAL FOR PHASE LOCKED LOOP IN WIND TURBINE POWER SYSTEMS

FIELD

The present disclosure relates generally to wind turbine power systems, and more specifically, to a system and method for reducing the delay between a power command and the actual power of a wind turbine power system using a power angle feedforward signal in a phase locked loop (PLL) of the power system.

BACKGROUND

Wind power is considered one of the cleanest, most environmentally friendly energy sources presently available, and wind turbines have gained increased attention in this regard. A modern wind turbine typically includes a tower, a generator, a gearbox, a nacelle, and a rotor. The rotor typically includes a rotatable hub having one or more rotor blades attached thereto. A pitch bearing is typically configured operably between the hub and the rotor blade to allow for rotation about a pitch axis. The rotor blades capture kinetic energy of wind using known airfoil principles. The rotor blades transmit the kinetic energy in the form of rotational energy so as to turn a shaft coupling the rotor blades to a gearbox, or if a gearbox is not used, directly to the generator. The generator then converts the mechanical energy to electrical energy that may be deployed to a utility grid.

A power output of the generator increases with wind speed until the wind speed reaches a rated wind speed for the wind turbine. At and above the rated wind speed, the generator operates at a rated power. The rated power is an output power at which the generator can operate with a level of fatigue to turbine components that is predetermined to be acceptable. At wind speeds higher than a certain speed, or at a wind turbulence level that exceeds a predetermined magnitude, typically referred to as a "trip limit" or "monitor set point limit," wind turbines may be shut down, or the loads may be reduced by regulating the pitch of the rotor blades or braking the rotor, in order to protect wind turbine components against damage.

Variable speed operation of the generator facilitates enhanced capture of energy by the generator when compared to a constant speed operation of the wind turbine generator; however, variable speed operation of the generator produces electricity having varying voltage and/or frequency. More specifically, the frequency of the electricity generated by the variable speed generator is proportional to the speed of rotation of the rotor. Thus, a power converter may be coupled between the generator and the utility grid. The power converter outputs electricity having a fixed voltage and frequency for delivery on the grid.

Wind energy generation and, particularly, reactive power control of the wind turbine power system should take an active part in the stability and quality of the electrical grid. Thus, reactive power compensation of the wind turbine power system is configured to fulfill electrical network demands and maintain a reactive power reserve in order to support grid contingencies. Such objectives may lead to giving priority to reactive power over active power production depending on network conditions. Thus, in a typical wind turbine power system, the turbine controller receives a power command from a farm-level controller that is based on various grid conditions. As such, the power command instructs each wind turbine how much reactive and active power should be generated based on the grid.

In weak grids, the response to a power command can be sluggish. The slow response can be detrimental to functions that require rapid change of power to stabilize the power system (e.g. the drivetrain damper, fast power reduction functions, etc.).

Accordingly, the present disclosure is directed to systems and methods for reducing the delay between a power command and the actual power of wind turbine power systems using a power angle feedforward signal in a phase locked loop (PLL) of the power system.

BRIEF DESCRIPTION

Aspects and advantages of the invention will be set forth in part in the following description, or may be obvious from the description, or may be learned through practice of the invention.

In one aspect, the present disclosure is directed to a method for reducing a delay between a power command and actual power of a power system connected to a power grid. The method includes receiving, via a power angle estimator, a power command of the power system. The method also includes receiving, via the power angle estimator, one or more grid conditions of the power grid. Further, the method includes estimating, via the power angle estimator, a power angle signal across the power system based on the power command and/or the one or more grid conditions. The method further includes receiving, via a phase locked loop (PLL), the estimated power angle signal. Moreover, the method includes generating, via the PLL, a PLL phase angle signal based, at least in part, on the estimated power angle signal. Thus, the method further includes controlling, via a converter controller, a power conversion assembly of the power system based on the PLL phase angle signal.

In one embodiment, the method includes receiving, via the PLL, the power angle signal as a feedforward signal.

In another embodiment, the step of estimating the power angle signal across the power system may include calculating the power angle signal as a function of a transmitted power and a reactance between two electric buses at or near ends of the power system. More specifically, in one embodiment, the step of estimating the power angle signal across the power system may include calculating the power angle signal as a function of the transmitted power, voltage magnitudes at the two ends of the power system, and the reactance between the two electric buses at or near the ends of the power system.

For example, in certain embodiments, the step of calculating the power angle signal as a function of the transmitted power, the voltage magnitudes at the two ends of the power system, and the reactance between the two electric buses at or near ends of the power system may include multiplying the voltage magnitudes at the two ends of the power system to obtain a first multiplied value, dividing the reactance between the two electric buses at or near the ends of the power system by the first multiplied value to obtain a multiplier, multiplying the transmitted power by the multiplier to obtain a second multiplied value, and applying a non-linear function to the second multiplied value. In particular embodiments, the non-linear function may include, for example, polynomial, sine, cosine, or arcsine.

In further embodiments, the step of generating the PLL phase angle signal based, at least in part, on the estimated power angle signal may include receiving a terminal grid voltage feedback signal, determining a PLL error signal based on the terminal grid voltage feedback signal, determining, via a PLL regulator, a frequency signal of the PLL in response to the PLL error signal, integrating the frequency signal via an integrator of the PLL to obtain an output signal, and generating the PLL phase angle signal based on the output signal and the power angle signal. For example, in one embodiment, the step of generating the PLL phase angle signal based on the output signal and the power angle signal may include adding the output signal and the power angle signal.

In yet another embodiment, the power system may be a wind turbine power system, a solar power system, an energy storage system, and/or combinations thereof.

In another aspect, the present disclosure is directed to an electrical power system connected to a power grid. The electrical power system includes an electric generator, a power conversion assembly coupled to the electric generator, a power angle estimator, a phase locked loop (PLL), and a converter controller. The power conversion assembly is configured to receive power generated by the electric generator and convert the power received to a power suitable for transmission to the power grid. The power angle estimator is configured to estimate a power angle signal across the electrical power system based on a received power command and/or one or more grid conditions. The PLL is configured to generate a PLL phase angle signal based, at least in part, on the estimated power angle signal. Thus, the converter controller controls the power conversion assembly based on the PLL phase angle signal. It should be understood that the electrical power system may further include any of the additional features as described herein.

In yet another aspect, the present disclosure is directed to a wind turbine connected to a power grid. The wind turbine includes a tower, a nacelle mounted atop the tower, a rotor having a rotatable hub and at least one rotor blade mounted thereto, and a power generation and delivery system. The power generation and delivery system includes an electric generator connected to a power grid, a power conversion assembly coupled to the electric generator a power angle estimator, a phase locked loop (PLL), and converter controller. The power conversion assembly is configured to receive power generated by the electric generator and convert the power received to a power suitable for transmission to the power grid. The power angle estimator is configured to estimate a power angle signal across the wind turbine based on a received power command and/or one or more grid conditions. The PLL is configured to generate a PLL phase angle signal based, at least in part, on the estimated power angle signal. Thus, the converter controller controls the power conversion assembly based on the PLL phase angle signal. It should be understood that the wind turbine may further include any of the additional features as described herein.

These and other features, aspects and advantages of the present invention will become better understood with reference to the following description and appended claims. The accompanying drawings, which are incorporated in and constitute a part of this specification, illustrate the embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
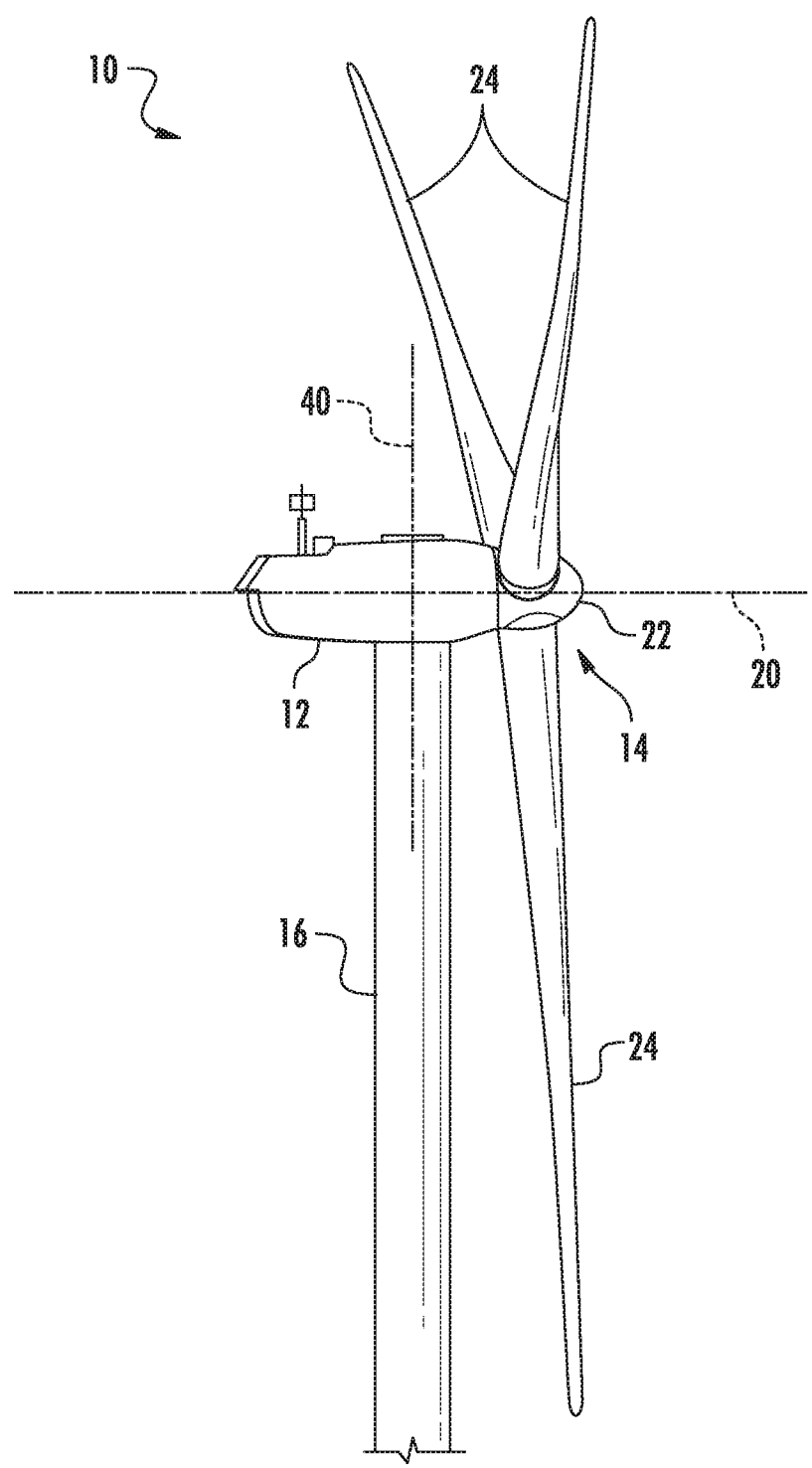
FIG. 1 illustrates a perspective view of one embodiment of a portion of a wind turbine according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to systems and methods for reducing the delay between a power command and the actual power of a wind turbine power system using a phase locked loop (PLL) feedforward signal. In weak grids, the response to a power command is sluggish, which is detrimental to functions that require rapid change of power to stabilize the power system, e.g. drive-train damper and fast power reduction functions. As such, the PLL feedforward signal is useful for reducing the delay between the power command and actual power.

More specifically, in AC transmission systems, the power transfer correlates with the power angle across the system. By estimating the power angle as a feedforward contribution to the phase-locked loop, the PLL feedforward signal establishes the reference frame for the vector control functions in the power converter of the power system. As such, the systems and methods of the present disclosure cause the reference frame to move according to the estimated angle change needed to implement the power command, thereby reducing the need for the PLL closed loop to adjust via its error path.

Referring now to the drawings, FIG. 1 illustrates a perspective view of one embodiment of a wind turbine power system 10 (also referred to herein simply as wind turbine 10) according to the present disclosure. As shown, the wind turbine 10 described herein includes a horizontal-axis configuration, however, in some embodiments, the wind turbine 10 may include, in addition or alternative to the horizontal-axis configuration, a vertical-axis configuration (not shown). The wind turbine 10 may be coupled to an electrical load (not shown in FIG. 1), such as, but not limited to, a power grid, for receiving electrical power therefrom to drive operation of the wind turbine 10 and/or its associated components and/or for supplying electrical power generated by the wind turbine 10 thereto.

The wind turbine 10 may include a nacelle 12 and a rotor (generally designated by 14) coupled to nacelle 12 for rotation with respect to nacelle 12 about an axis of rotation 20. In one embodiment, the nacelle 12 is mounted on a tower 16, however, in some embodiments, in addition or alternative to the tower-mounted nacelle 12, the nacelle 12 may be positioned adjacent the ground and/or a surface of water. The rotor 14 includes a hub 22 and a plurality of rotor blades 24 extending radially outwardly from the hub 22 for converting wind energy into rotational energy. Although the rotor 14 is described and illustrated herein as having three rotor blades 24, the rotor 14 may have any number of rotor blades 24. Further, the rotor blades 24 may each have any length that allows the wind turbine 10 to function as described herein.

Figure 2:
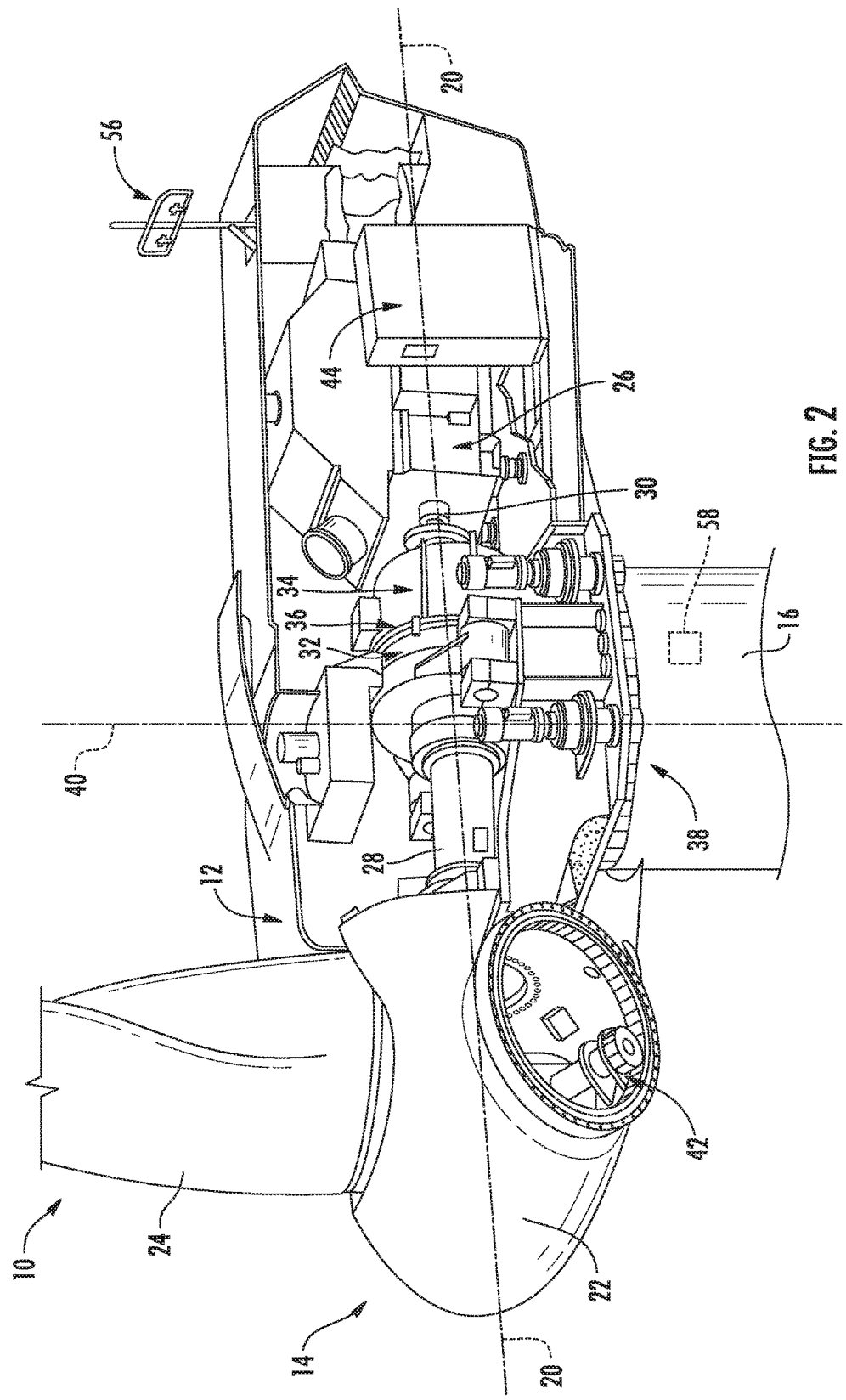
FIG. 2 illustrates an internal, perspective view of one embodiment of a nacelle of the wind turbine according to the present disclosure.

Referring now to FIG. 2, the wind turbine 10 also includes an electrical generator 26 coupled to the rotor 14 for generating electrical power from the rotational energy generated by the rotor 14. The generator 26 may be any suitable type of electrical generator, such as, but not limited to, a wound rotor induction generator, a double-fed induction generator (DFIG, also known as dual-fed asynchronous generators), a permanent magnet (PM) synchronous generator, an electrically-excited synchronous generator, and a switched reluctance generator. The generator 26 includes a stator (not shown) and a rotor (not shown) with an air gap included therebetween. The rotor 14 includes a rotor shaft 28 coupled to the rotor hub 22 for rotation therewith. Further, the generator 26 is coupled to the rotor shaft 28 such that rotation of the rotor shaft 28 drives rotation of the generator rotor, and therefore operation of the generator 26. In one embodiment, the generator rotor has a generator shaft 30 coupled thereto and coupled to the rotor shaft 28 such that rotation of the rotor shaft 28 drives rotation of the generator rotor. In other embodiments, the generator rotor is directly coupled to the rotor shaft 28, sometimes referred to as a "direct-drive wind turbine." In one embodiment, the generator shaft 30 is coupled to the rotor shaft 28 through a gearbox 32, although in other embodiments generator shaft 30 is coupled directly to rotor shaft 28.

The torque of the rotor 14 drives the generator rotor to thereby generate variable frequency AC electrical power from rotation of rotor 14. The generator 26 has an air gap torque between the generator rotor and stator that opposes the torque of rotor 14. A power conversion assembly 34 is coupled to the generator 26 for converting the variable frequency AC to a fixed frequency AC for delivery to an electrical load (not shown in FIG. 2), such as, but not limited to a power grid (not shown in FIG. 2), coupled to the generator 26. The power conversion assembly 34 may include a single frequency converter or a plurality of frequency converters configured to convert electricity generated by the generator 26 to electricity suitable for delivery over the power grid. The power conversion assembly 34 may also be referred to herein as a power converter. The power conversion assembly 34 may be located anywhere within or remote to the wind turbine 10. For example, the power conversion assembly 34 may be located within a base (not shown) of the tower 16.

In certain embodiments, the wind turbine 10 may include a rotor speed limiter, for example, but not limited to a disk brake 36. The disk brake 36 brakes rotation of the rotor 14 to, for example, slow rotation of the rotor 14, the brake rotor 14 against full wind torque, and/or reduce the generation of electrical power from the generator 26. Furthermore, in some embodiments, the wind turbine 10 may include a yaw system 38 for rotating the nacelle 12 about an axis of rotation 40 for changing a yaw of rotor 14, and more specifically for changing a direction faced by the rotor 14 to, for example, adjust an angle between the direction faced by the rotor 14 and a direction of wind.

In one embodiment, the wind turbine 10 includes a variable blade pitch system 42 for controlling, including but not limited to changing, a pitch angle of blades 24 (shown in FIGS. 1-2) with respect to a wind direction. The pitch system 42 may be coupled to a controller 44 for control thereby. The pitch system 42 is coupled to the hub 22 and the rotor blades 24 for changing the pitch angle of blades 24 by rotating the rotor blades 24 with respect to the hub 22. The pitch actuators may include any suitable structure, configuration, arrangement, means, and/or components, whether described and/or shown herein, such as, but not limited to, electrical motors, hydraulic cylinders, springs, and/or servomechanisms. Moreover, the pitch actuators may be driven by any suitable means, whether described and/or shown herein, such as, but not limited to, hydraulic fluid, electrical power, electro-chemical power, and/or mechanical power, such as, but not limited to, spring force.

Figure 3:
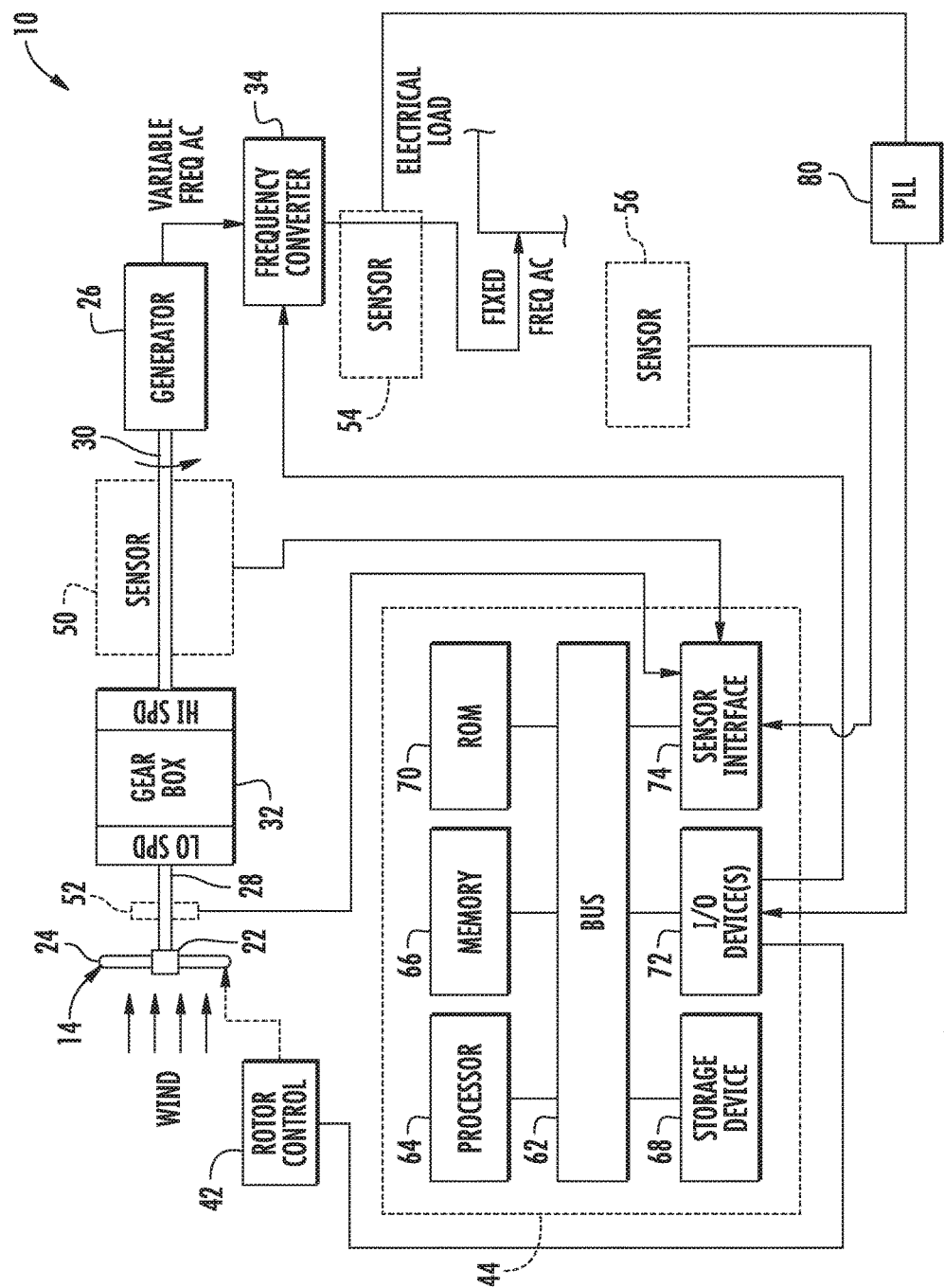
FIG. 3 illustrates a block diagram of one embodiment of various electrical components of a wind turbine according to the present disclosure.

Referring now to FIG. 3, a block diagram of one embodiment of various electrical components of the wind turbine 10 according to the present disclosure is illustrated. As shown, the wind turbine 10 includes one or more controllers 44 coupled to at least one component of wind turbine 10 for generally controlling operation of the wind turbine 10 and/or controlling operation of the components thereof, regardless of whether such components are described and/or shown herein. For example, in one embodiment, the controller 44 is coupled to the pitch system 42 for generally controlling the rotor 14. In addition, the controller 44 may be mounted within the nacelle 12 (as shown in FIG. 2), however, additionally or alternatively, one or more controllers 44 may be remote from the nacelle 12 and/or other components of the wind turbine 10. The controller(s) 44 may be used for overall system monitoring and control including, without limitation, pitch and speed regulation, high-speed shaft and yaw brake application, yaw and pump motor application, and/or fault monitoring. Alternative distributed or centralized control architectures may be used in some embodiments.

Figure 4:
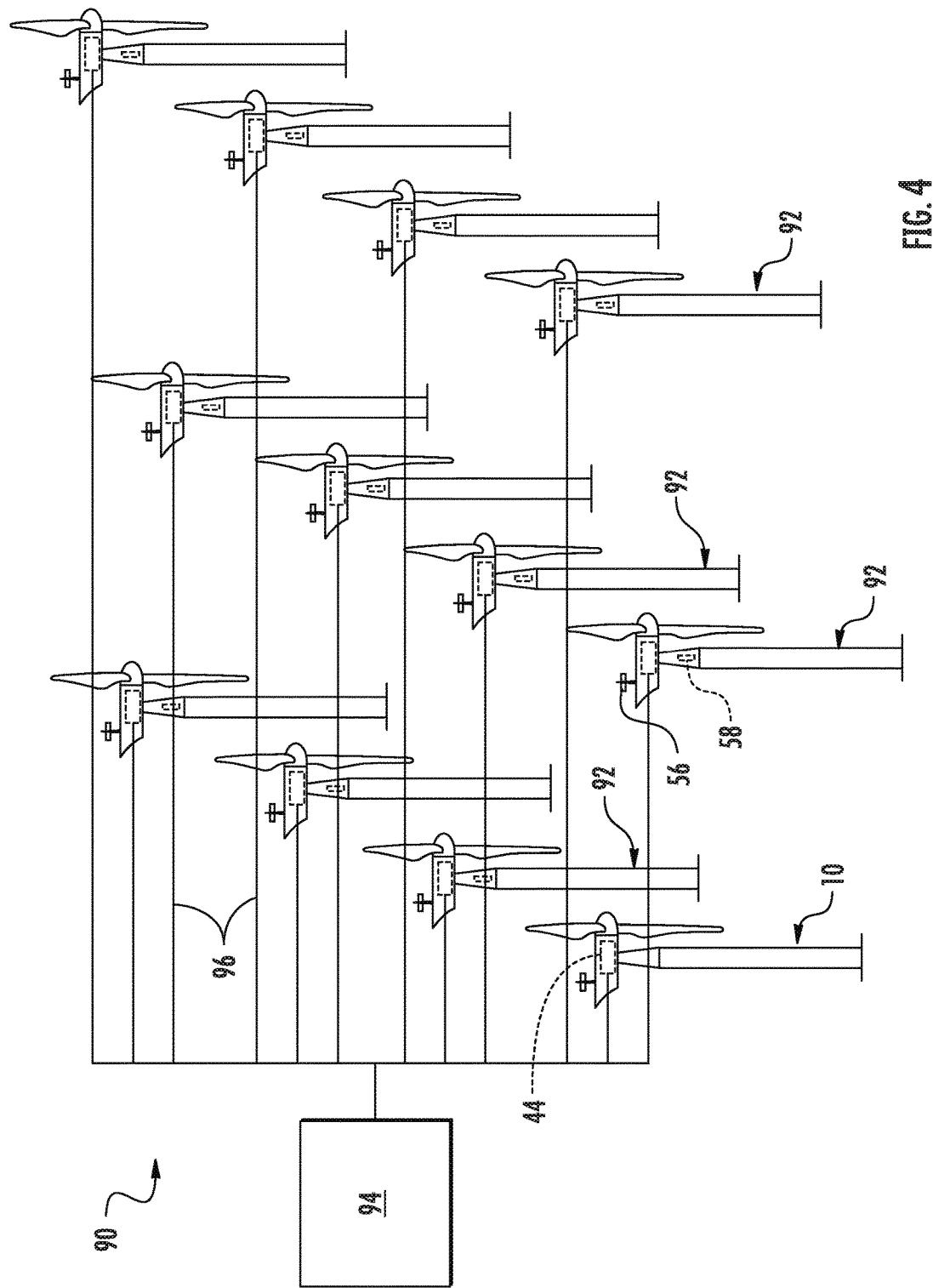
FIG. 4 illustrates a schematic view of one embodiment of a wind farm according to the present disclosure.

In one embodiment, the wind turbine 10 includes a plurality of sensors, for example, sensors 50, 52, 54, 56, 58 as shown in FIGS. 1, 2, and 4. As such, the sensors 50, 52, 54, 56, 58 are configured to measure a variety of parameters including, without limitation, operating conditions and atmospheric conditions. For example, as shown, the wind turbine 10 includes a wind sensor 56, such as an anemometer or any other suitable device, configured for measuring wind speeds or any other wind parameter. The wind parameters include information regarding at least one of or a combination of the following: a wind gust, a wind speed, a wind direction, a wind acceleration, a wind turbulence, a wind shear, a wind veer, a wake, SCADA information, or similar. Further, the wind turbine 10 may also include one or more additional sensors for monitoring additional operational parameters of the wind turbine 10. Further, each sensor 50, 52, 54, 56, 58 may be an individual sensor or may include a plurality of sensors. The sensors 50, 52, 54, 56, 58 may be any suitable sensor having any suitable location within or remote to wind turbine 10 that allows the wind turbine 10 to function as described herein. In some embodiments, the sensors 50, 52, 54, 56, 58 are coupled to one of the controllers 44, 94, 156 described herein for transmitting measurements to the controllers 44, 94, 156 for processing thereof.

Still referring to FIG. 3, the controller 44 may include a bus 62 or other communications device to communicate information. Further, one or more processor(s) 64 may be coupled to the bus 62 to process information, including information from the sensors 50, 52, 54, 56, 58 and/or other sensor(s). The processor(s) 64 may include at least one computer. As used herein, the term computer is not limited to integrated circuits referred to in the art as a computer, but broadly refers to a processor, a microcontroller, a microcomputer, a programmable logic controller (PLC), an application specific integrated circuit, and other programmable circuits, and these terms are used interchangeably herein.

The controller 44 may also include one or more random access memories (RAM) 66 and/or other storage device(s) 68. Thus, as shown, the RAM(s) 66 and storage device(s) 68 may be coupled to the bus 62 to store and transfer information and instructions to be executed by processor(s) 64. The RAM(s) 66 (and/or storage device(s) 68, if included) can also be used to store temporary variables or other intermediate information during execution of instructions by the processor(s) 64. The controller 44 may also include one or more read only memories (ROM) 70 and/or other static storage devices coupled to the bus 62 to store and provide static (i.e., non-changing) information and instructions to the processor(s) 64. The processor(s) 64 process information transmitted from a plurality of electrical and electronic devices that may include, without limitation, speed and power transducers. Instructions that are executed include, without limitation, resident conversion and/or comparator algorithms. The execution of sequences of instructions is not limited to any specific combination of hardware circuitry and software instructions.

The controller 44 may also include, or may be coupled to, input/output device(s) 72. The input/output device(s) 72 may include any device known in the art to provide input data to the controller 44 and/or to provide outputs, such as, but not limited to, yaw control and/or pitch control outputs. Instructions may be provided to the RAM 66 from the storage device 68 including, for example, a magnetic disk, a read-only memory (ROM) integrated circuit, CD-ROM, and/or DVD, via a remote connection that is either wired or wireless providing access to one or more electronically-accessible media. In some embodiments, hard-wired circuitry can be used in place of or in combination with software instructions. Thus, execution of sequences of instructions is not limited to any specific combination of hardware circuitry and software instructions, whether described and/or shown herein. Also, in one embodiment, the input/output device(s) 72 may include, without limitation, computer peripherals associated with an operator interface such as a mouse and a keyboard (neither shown in FIG. 3). Alternatively, other computer peripherals may also be used that may include, for example, a scanner (not shown in FIG. 3). Furthermore, in one embodiment, additional output channels may include, for example, an operator interface monitor (not shown in FIG. 3). The controller 44 may also include a sensor interface 74 that allows controller 44 to communicate with the sensors 50, 52, 54, 56, 58 and/or other sensor(s). The sensor interface 74 may include one or more analog-to-digital converters that convert analog signals into digital signals that can be used by the processor(s) 64.

In another embodiment, the wind turbine 10 also includes a phase locked loop (PLL) 80. For instance, as shown, the PLL 80 is coupled to sensor 54. In one embodiment, as shown, the sensor 54 is a voltage transducer configured to measure a terminal grid voltage output by frequency converter 34. Alternatively, the PLL 80 is configured to receive a plurality of voltage measurement signals from a plurality of voltage transducers. In an example of a three-phase generator, each of three voltage transducers is electrically coupled to each one of three phases of a grid bus. The PLL 80 may be configured to receive any number of voltage measurement signals from any number of voltage transducers that allow the PLL 80 to function as described herein.

Referring now to FIG. 4, the wind turbine 10 described herein may be part of a wind farm 90 that is controlled according to the system and method of the present disclosure is illustrated. As shown, the wind farm 90 may include a plurality of wind turbines 92, including the wind turbine 10 described above, and a farm-level controller 94. For example, as shown in the illustrated embodiment, the wind farm 90 includes twelve wind turbines, including wind turbine 10. However, in other embodiments, the wind farm 90 may include any other number of wind turbines, such as less than twelve wind turbines or greater than twelve wind turbines. In one embodiment, the controller 44 of the wind turbine 10 may be communicatively coupled to the farm-level controller 94 through a wired connection, such as by connecting the controller 44 through suitable communicative links 96 or networks (e.g., a suitable cable). Alternatively, the controller 44 may be communicatively coupled to the farm-level controller 94 through a wireless connection, such as by using any suitable wireless communications protocol known in the art. In addition, the farm-level controller 94 may be generally configured similar to the controllers 44 for each of the individual wind turbines 92 within the wind farm 90.

Figure 5:
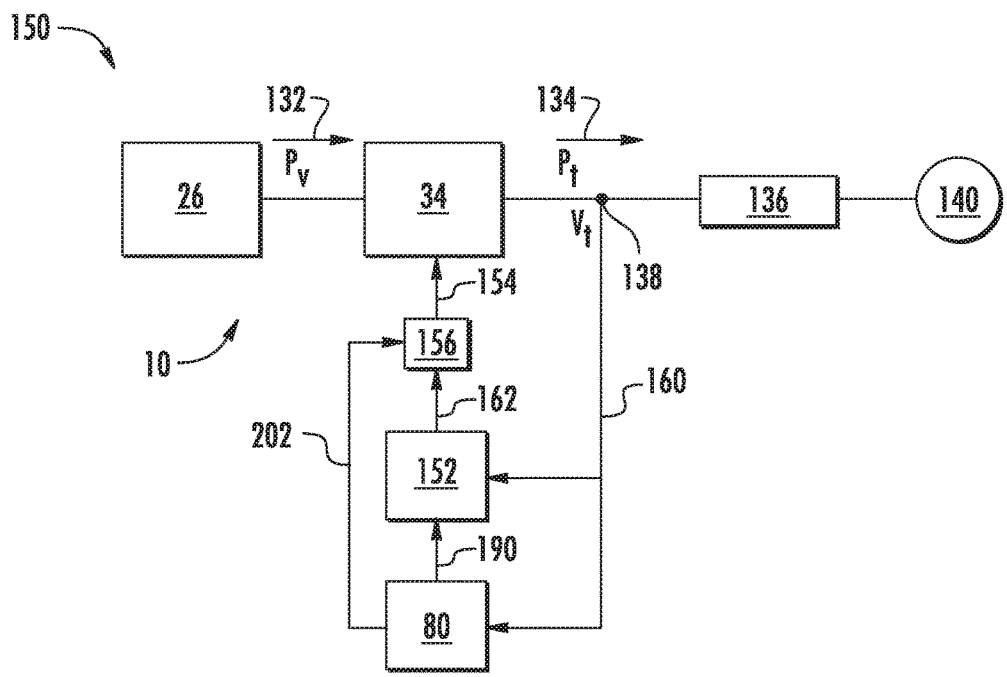
FIG. 5 illustrates a block diagram of one embodiment of a power generation and delivery system that may include the wind turbine shown in FIG. 1.

Referring now to FIG. 5, a block diagram of one embodiment of a power generation and delivery system 150 of the wind turbine 10 is illustrated. As shown, the power generation and delivery system 150 includes an energy source, for example, the generator 26. Although described herein as the wind turbine generator 26, the energy source may include any type of electrical generator that allows the system 150 to function as described herein. The system 150 also includes a power converter, such as, the power converter 34. Thus, as shown, the power converter 34 receives variable frequency electrical power 132 generated by the generator 26 and converts electrical power 132 to an electrical power 134 (referred to herein as a terminal power 134) suitable for transmission over an electric power transmission and distribution grid 136 (referred to herein as utility grid 136). A terminal voltage ($V_t$) 138 is defined at a node between the power converter 34 and the utility grid 136. A load 140 is coupled to the utility grid 136 where a Thevenin voltage is defined. As described above, variable speed operation of the wind turbine 10 facilitates enhanced capture of energy when compared to a constant speed operation of the wind turbine 10, however, variable speed operation of the wind turbine 10 produces the electrical power 132 having varying voltage and/or frequency. More specifically, the frequency of the electrical power 132 generated by the variable speed generator 26 is proportional to the speed of rotation of the rotor 14 (shown in FIG. 1). In one embodiment, the power converter 34 outputs the terminal power 134 having a substantially fixed voltage and frequency for delivery on the utility grid 136.

The power converter 34 also controls an air gap torque of the generator 26. The air gap torque is present between the generator rotor (not shown in FIG. 3) and the generator stator (not shown in FIG. 3) and opposes the torque applied to the generator 26 by the rotor 14. A balance between a torque on the rotor 14 created by interaction of the rotor blades 24 and the wind and the air gap torque facilitates stable operation of the wind turbine 10. Wind turbine adjustments, for example, blade pitch adjustments, or grid events, for example, low voltage transients or zero voltage transients on the utility grid 136, may cause an imbalance between the torque on the rotor 14 caused by the wind and the air gap torque. The power converter 34 controls the air gap torque which facilitates controlling the power output of the generator 26, however, the wind turbine 10 may not be able to operate through certain grid events, or may sustain wear and/or damage due to certain grid events, due to a time period required for adjustments to wind turbine operation to take effect after detecting the grid event.

Still referring to FIG. 5, the system 150 may include a grid-dependent power limiter system 152. In such embodiments, a controller, for example, but not limited to, controller 44 (shown in FIG. 3), may be programmed to perform the functions of the grid-dependent power limiter system 152. However, in alternative embodiments, the functions of the grid-dependent power limiter system 152 may be performed by any circuitry configured to allow the system 150 to function as described herein. The power limiter system 152 is configured to identify the occurrence of a grid contingency event, and provide the power converter 34 with signals that facilitate providing a stable recovery from the grid event.

The power conversion assembly 34 is configured to receive control signals 154 from a converter interface controller 156. The control signals 154 are based on sensed operating conditions or operating characteristics of the wind turbine 10 as described herein and used to control the operation of the power conversion assembly 34. Examples of measured operating conditions may include, but are not limited to, a terminal grid voltage, a PLL error, a stator bus voltage, a rotor bus voltage, and/or a current. For example, the sensor 54 measures terminal grid voltage 138 and transmits a terminal grid voltage feedback signal 160 to power limiter system 152. The power limiter system 152 generates a power command signal 162 based at least partially on the feedback signal 160 and transmits power command signal 162 to the converter interface controller 156. In an alternative embodiment, the converter interface controller 156 is included within the system controller 44. Other operating condition feedback from other sensors also may be used by the controller 44 and/or converter interface controller 156 to control the power conversion assembly 34.

Figure 6:
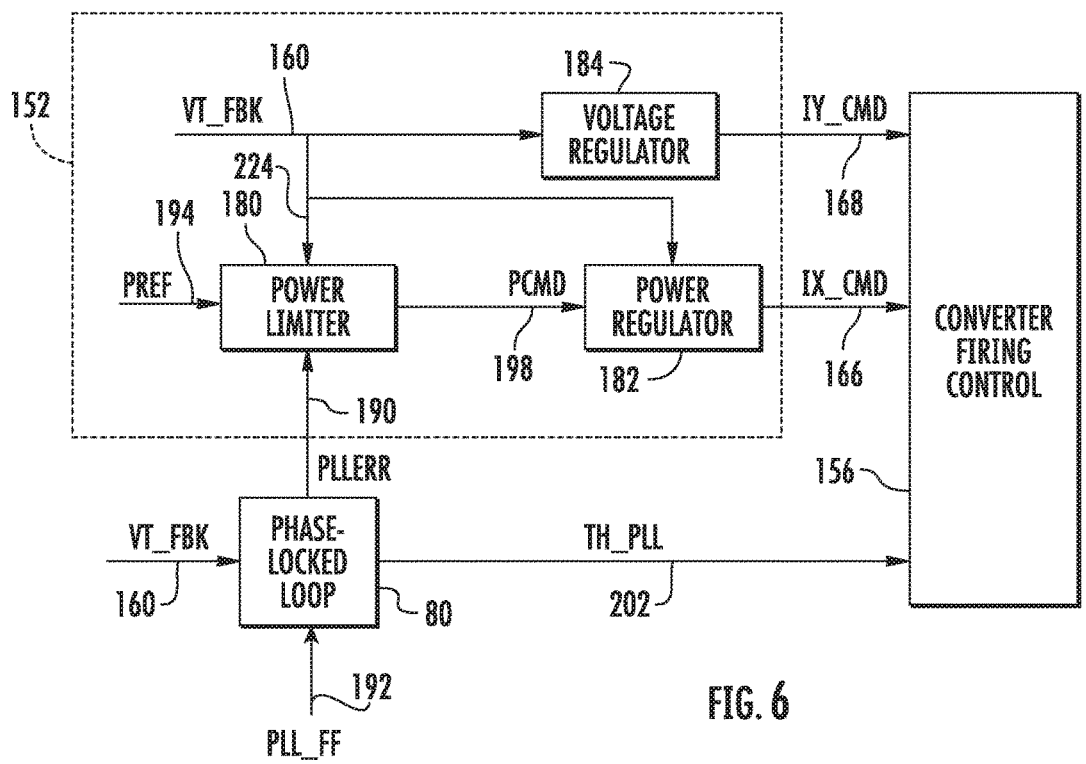
FIG. 6 illustrates a block diagram of one embodiment of a power limiter system that may be included within the power generation and delivery system shown in FIG. 4.

As mentioned, the systems and methods described herein facilitate reducing the delay between a power command and the actual power of a wind turbine power system, such as wind turbine 10. Thus, as shown in FIG. 6, a block diagram of one embodiment of the power limiter system 152 of the wind turbine 10 according to the present disclosure is illustrated. As shown, the power limiter system 152 is configured to output the power command signal 162 (shown in FIG. 5), which in one embodiment, is at least one of a real current command signal 166 and a reactive current command signal 168. In addition, as shown, the power limiter system 152 includes a power limiter 180, a power regulator 182, and a voltage regulator 184. In one instance, the power limiter 180 receives at least one measured operating condition of the system 150. The measured operating condition(s) may include, but is not limited to, a PLL error signal 190 (e.g. PLLERR) from the PLL 80 and the terminal grid voltage feedback signal 160 (e.g. VT_FBK) from the sensor 54.

The power limiter 180 also receives a stored reference power control signal 194 (e.g. PREF) from, for example, the controller 44 (FIG. 3). In some embodiments, the power limiter 180 receives the power limit control signal 224 and the reference power control signal 194 and generates the power command signal 198 corresponding to the lesser of the power limit control signal 224 and the reference power control signal 194. Thus, as shown, the power limiter 180 generates the power command signal 198 (e.g. PCMD) and transmits the power command signal 198 to the power regulator 182. The power regulator 182 then generates the real current command signal 166 and transmits the signal 166 to the converter interface controller 156. The real current command signal 166 instructs the converter interface controller 156 to modify a real component of current that the power conversion assembly 34 tries to inject onto the utility grid 136.

Still referring to FIG. 6, the voltage regulator 184 generates the reactive current command signal 168 (e.g. IY CMD) and sends the command signal 168 to the converter interface controller 156. The current command signal 168 instructs the converter interface controller 156 to modify a reactive component of current injected onto the utility grid 136. As shown, the converter interface controller 156 may also be referred to herein as a converter firing control. As described above, the PLL 80 may be included within the controller 44, or may be coupled to, but separate from, the controller 44.

The PLL 80 also receives the terminal voltage feedback signal 160. For example, the PLL 80 may receive the terminal voltage feedback signal 160 (shown in FIG. 3 as $V_t$) provided by the sensor 54 (shown in FIG. 3). In addition, as shown, the PLL 80 receives a PLL feedforward signal 192 (e.g. PLL_FF), which is described in more detail in reference to FIG. 7 below. As described above, the PLL 80 also generates the PLL error signal 190 (e.g. PLLERR) and a PLL phase angle signal 202 (e.g. TH PLL). The PLL phase angle signal 202 is transmitted to the converter interface controller 156 for control of the power conversion assembly 34 and for subsequent control of electrical currents injected onto the utility grid 136 (shown in FIG. 5).

Figure 7:
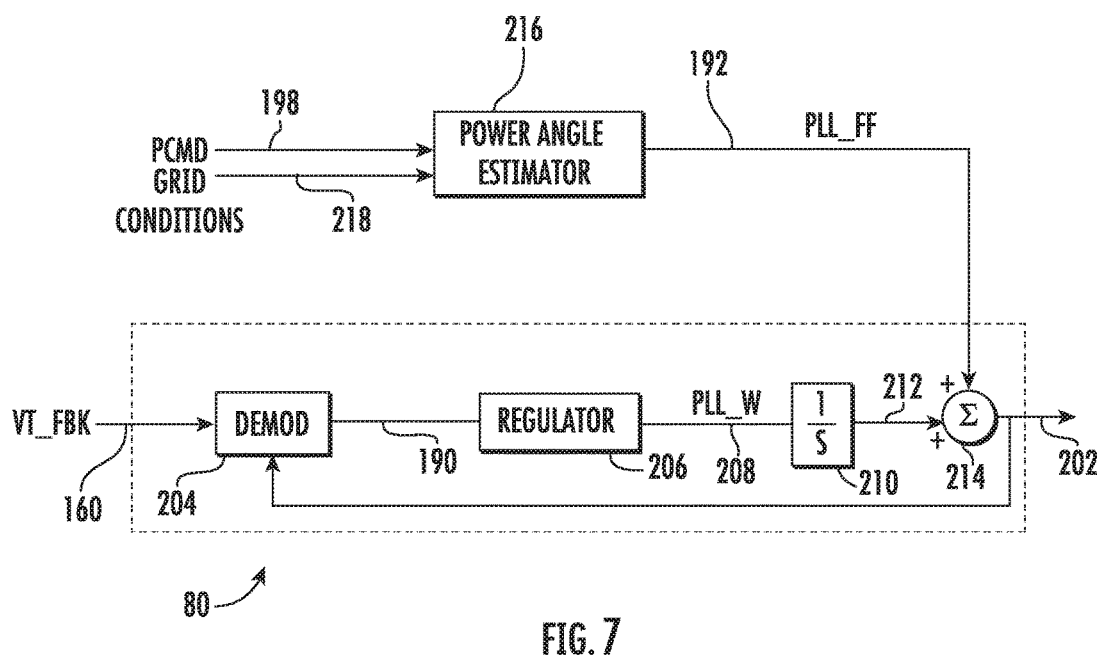
FIG. 7 illustrates a schematic diagram of one embodiment of a phase locked loop (PLL) that may be included within the power generation and delivery system shown in FIG. 4.

More specifically, as shown in FIG. 7, a detailed schematic view of the PLL 80 is illustrated. As shown, the PLL 80 may generally include a demodulator 204 that receives the terminal voltage feedback signal 160. As such, the demodulator 204 is configured to extract the phase error between the original terminal voltage feedback carrier wave (i.e. the voltage feedback signal 160) and the PLL angle. The demodulator 204 generates the PLL error signal 190 that is regulated via the PLL regulator 206. The PLL regulator 206 then determines a frequency signal 208 (i.e. PLL W) of the PLL 80 in response to the PLL error signal 190. The frequency signal 208 may then be integrated via integrator 210 of the PLL 80. The output signal 212 of the integrator 210 is then sent to function block 214.

Still referring to FIG. 7, the PLL feedforward signal 192 (which may also be referred to herein as a power angle signal) may be estimated via a power angle estimator 216. As used herein, the term "feedforward" encompasses its broadest interpretation, which generally describes an element or pathway within a control system that passes a controlling signal from a source in its external environment to a load elsewhere in its external environment. Thus, as shown, the power angle signal 192 is estimated external to the PLL 80 and then input into the PLL 80. Accordingly, the power angle estimator 216 is configured to estimate or calculate a power angle across the electrical power system (e.g. the wind turbine 10) based on the received power command PCMD 198 and/or one or more external grid conditions 218. For example, in one embodiment, the power angle (PA) may be estimated using Equation (1) below (which assumes that the voltages of the power system remain constant and the angle is below about 30 degrees):

$$PA = P*X \qquad \text{Equation (1)}$$

Where P is the transmitted power,
X is the reactance between two electric buses at or near the ends of the power system, and
PA is the angle between the two ends of the power system (also referred to herein as "power angle"). In such embodiments, the external grid conditions 218 are used to improve the estimated power angle. For example, by using the external grid conditions 218, the power angle estimator 216 may provide a more accurate estimate of the reactance X based on e.g. the status of the system breakers on external transmission lines.

In alternative embodiments, the power angle (PA) may be estimated using a non-linear function. For example, in one embodiment, the non-linear function may include a polynomial or trigonometric function, such as but not limited to sine, cosine, or arcsine. Thus, in a particular embodiment, the power angle (PA) may be estimated using Equation (2) below:

$$PA = \arcsin [P*X/(V1*V2)] \qquad \text{Equation (2)}$$

Where P is the transmitted power,
V1 and V2 are the voltage magnitudes at twos ends of the power system,
X is the reactance between the two electric buses at or near the ends of the power system, and
PA is the angle between the two ends of the power system (also referred to herein as "power angle"). In such embodiments, the external grid conditions 218 may be used to improve the estimated power angle. For example, by using the external grid conditions 218, the power angle estimator 216 may provide a more accurate estimate of the voltage magnitudes V2 and V1.

At function block 214, the PLL 80 is configured to generate the PLL phase angle signal 202 based on the estimated feedforward power angle signal 192 and the output signal of the integrator 210. More specifically, as shown, the PLL 80 generates the PLL phase angle signal 202 by summing the estimated feedforward power angle signal 192 and the output signal 212 of the integrator 210. Thus, as shown in FIG. 6, the converter controller 156 controls the power conversion assembly 34 based on the PLL phase angle signal.

Figure 8:
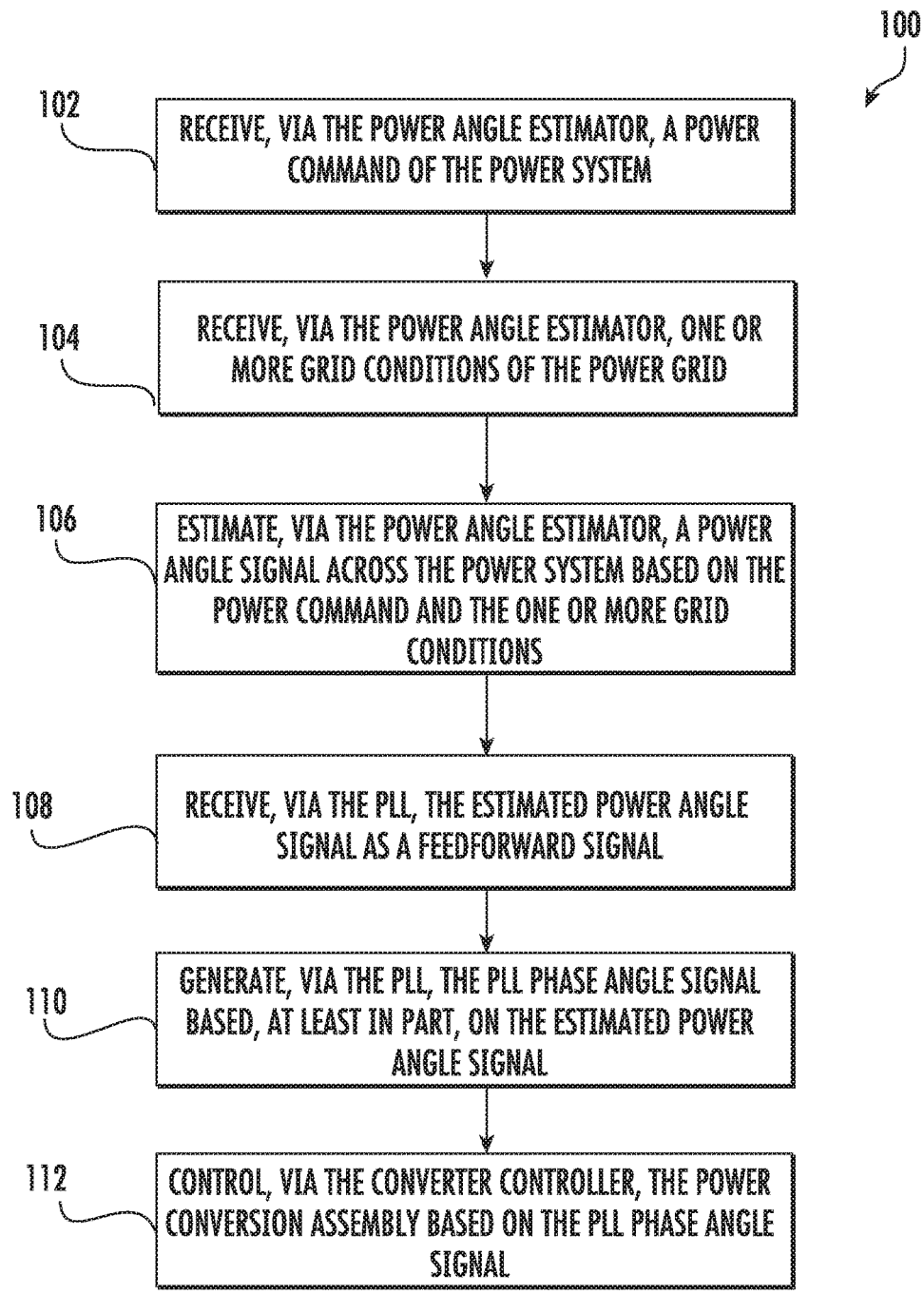
FIG. 8 illustrates a flow diagram of one embodiment of a method for reducing a delay between a power command and actual power of a wind turbine according to the present disclosure.

Referring now to FIG. 8, a flow diagram of one embodiment of a method 100 for reducing a delay between the power command 198 and actual power of the wind turbine 10 is illustrated. As shown at 102, the method 100 includes receiving, via the power angle estimator 216, the power command 198 of the wind turbine power system 10. As shown at 104, the method 100 includes receiving, via the power angle estimator, one or more grid conditions of the power grid. For example, the grid condition may include, but are not limited to information that can assist in estimating the reactance X between the two electric buses at or near the ends of the power system, such as breaker status or alternatively a priori knowledge of the nature of the power grid. For example, the reactance of the grid may be known for a given project, in which case the parameter X can be set according to that a priori knowledge. Another example of such information may include knowing if a grid system may have one important transmission line that, if removed from service, will make a substantial change in the effective reactance. In such a scenario, the effective reactance would be computed a-priori knowing the characteristics of the grid with and without that important line in service. Then, during operation the selection of reactance X in the power angle estimation would be toggled between the two precomputed values of X depending upon the status of the circuit breakers on that line. As shown at 106, the method 100 includes estimating, via the power angle estimator 216, a power angle signal 192 across the power system based on the power command and/or the grid condition(s). As shown at 108, the method 100 includes receiving, via the PLL 80, the estimated power angle signal 192 as a feedforward signal. As shown at 110, the method 100 includes generating, via the PLL 80, the PLL phase angle signal 202 based, at least in part, on the estimated power angle signal 192. As shown at 112, the method 100 includes controlling, via the converter controller 156, the power conversion assembly 34 based on the PLL phase angle signal 202.

Thus, the feedforward function of the present disclosure provides less lag between the actual power and the power command, particularly in weak grids operating at high power. Benefits of the feedforward function of the present disclosure may depend on how close the estimated power angle is to the actual characteristic of the AC transmission system. As mentioned, Equation (2) above indicates example operating parameters needed to derive the power angle described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method for reducing a delay between a power command and actual power of a power system connected to a power grid, the method comprising:
   receiving, via a power angle estimator, a power command of the power system;
   receiving, via the power angle estimator, one or more grid conditions of the power grid;
   estimating, via the power angle estimator, a power angle signal across the power system based on the power command and the one or more grid conditions;
   receiving, via a phase locked loop (PLL), the estimated power angle signal;

generating, via the PLL, a PLL phase angle signal based, at least in part, on the estimated power angle signal; and, controlling, via a converter controller, a power conversion assembly of the power system based on the PLL phase angle signal.

2. The method of claim 1, further comprising receiving, via the PLL, the power angle signal as a feedforward signal.

3. The method of claim 1, wherein estimating the power angle signal across the power system further comprises:
calculating the power angle signal as a function of a transmitted power and a reactance between two electric buses at or near ends of the power system.

4. The method of claim 3, wherein estimating the power angle signal across the power system further comprises:
calculating the power angle signal as a function of the transmitted power, voltage magnitudes at the two ends of the power system, and the reactance between two electric buses at or near ends of the power system.

5. The method of claim 4, further comprising calculating the power angle signal as a non-linear function of the transmitted power, the voltage magnitudes at the two ends of the power system, and the reactance between the two electric buses at or near ends of the power system.

6. The method of claim 5, wherein calculating the power angle signal as a function of the transmitted power, the voltage magnitudes at the two ends of the power system, and the reactance between the two electric buses at or near ends of the power system further comprises:
multiplying the voltage magnitudes at the two ends of the power system to obtain a first multiplied value;
dividing the reactance between the two electric buses at or near ends of the power system by the first multiplied value to obtain a multiplier;
multiplying the transmitted power by the multiplier to obtain a second multiplied value; and,
applying a non-linear function to the second multiplied value.

7. The method of claim 5, wherein the non-linear function comprises at least one of polynomial, sine, cosine, or arcsine.

8. The method of claim 1, wherein generating the PLL phase angle signal based, at least in part, on the estimated power angle signal further comprises:
receiving a terminal grid voltage feedback signal;
determining a PLL error signal based on the terminal grid voltage feedback signal;
determining, via a PLL regulator, a frequency signal of the PLL in response to the PLL error signal;
integrating the frequency signal via an integrator of the PLL to obtain an output signal; and,
generating the PLL phase angle signal based on the output signal and the power angle signal.

9. The method of claim 8, wherein generating the PLL phase angle signal based on the output signal and the power angle signal further comprises adding the output signal and the power angle signal.

10. The method of claim 1, wherein the power system comprises at least one of a power system, a solar power system, or an energy storage system.

11. An electrical power system connected to a power grid, comprising:
an electric generator;
a power conversion assembly coupled to the electric generator, the power conversion assembly configured to receive power generated by the electric generator and convert the power received to a power suitable for transmission to the power grid;
a power angle estimator configured to estimate a power angle signal across the electrical power system based on a received power command and one or more grid conditions of the power grid;
a phase locked loop (PLL) configured to generate a PLL phase angle signal based, at least in part, on the estimated power angle signal; and,
a converter controller for controlling the power conversion assembly based on the PLL phase angle signal.

12. The electrical power system of claim 11, wherein the PLL receives the power angle signal as a feedforward signal.

13. The electrical power system of claim 11, wherein the power angle estimator estimates the power angle signal across the power system by calculating the power angle signal as a function of at least one of a transmitted power, voltage magnitudes at two ends of the power system, and the reactance between the two electric buses at or near ends of the power system.

14. The electrical power system of claim 13, wherein the power angle estimator calculates the power angle signal as a non-linear function of the transmitted power, the voltage magnitudes at the two ends of the power system, and the reactance between the two electric buses at or near ends of the power system.

15. The electrical power system of claim 14, wherein the non-linear function comprises at least one of polynomial, sine, cosine, or arcsine.

16. The electrical power system of claim 11, wherein the PLL generates the PLL phase angle signal based, at least in part, on the estimated power angle signal by:
receiving a terminal grid voltage feedback signal;
determining a PLL error signal based on the terminal grid voltage feedback signal;
determining, via a PLL regulator of the PLL, a frequency signal of the PLL in response to the PLL error signal;
integrating the frequency signal via an integrator of the PLL to obtain an output signal; and,
generating the PLL phase angle signal based on the output signal and the power angle signal.

17. The electrical power system of claim 16, wherein generating the PLL phase angle signal based on the output signal and the power angle signal further comprises adding the output signal and the power angle signal.

18. The electrical power system of claim 11, wherein the power system comprises at least one of a power system, a solar power system, or an energy storage system.

19. A wind turbine connected to a power grid, comprising:
a tower;
a nacelle mounted atop the tower;
a rotor comprising a rotatable hub and at least one rotor blade mounted thereto;
a power generation and delivery system comprising:
an electric generator connected to a power grid;
a power conversion assembly coupled to the electric generator, the power conversion assembly configured to receive power generated by the electric generator and convert the power received to a power suitable for transmission to the power grid;
a power angle estimator configured to estimate a power angle signal across the wind turbine based on a received power command and the one or more grid conditions;
a phase locked loop (PLL) configured to generate a PLL phase angle signal based, at least in part, on the estimated power angle signal; and, a converter controller for controlling the power conversion assembly based on the PLL phase angle signal.

20. The wind turbine of claim 19, wherein the PLL receives the power angle signal as a feedforward signal.

* * * * *